United States Patent [19]

Awaya et al.

[11] Patent Number: 5,019,531
[45] Date of Patent: May 28, 1991

[54] PROCESS FOR SELECTIVELY GROWING THIN METALLIC FILM OF COPPER OR GOLD

[75] Inventors: Nobuyoshi Awaya; Yoshinobu Arita, both of Isehara, Japan

[73] Assignee: Nippon Telegraph and Telephone Corporation, Tokyo, Japan

[21] Appl. No.: 354,158

[22] Filed: May 19, 1989

[30] Foreign Application Priority Data

May 23, 1988 [JP] Japan ............................ 63-124006
Dec. 26, 1988 [JP] Japan ............................ 63-326063

[51] Int. Cl.⁵ .................... H01L 21/44; C23C 16/00
[52] U.S. Cl. ................................ 437/180; 437/189; 437/192; 437/193; 427/125; 427/252
[58] Field of Search ............... 437/189; 427/125, 252

[56] References Cited

U.S. PATENT DOCUMENTS 2,704,728  3/1955  Pawlyk .
2,760,261  8/1956  Pawlyk et al. .
2,833,676  5/1958  Heibel et al. .
3,356,527  12/1967 Moshier et al. ................ 427/253
3,697,342  10/1972 Cuomo .
3,697,343  10/1972 Cuomo et al. .

FOREIGN PATENT DOCUMENTS 135179   3/1985  European Pat. Off. .
0260516  3/1988  European Pat. Off. .
0297348  1/1989  European Pat. Off. .
1330720  9/1973  United Kingdom .
2156336  10/1985 United Kingdom .

OTHER PUBLICATIONS

S. Wolf et al., Silicon Processing for the VLSI Era, Lattice Press, Sunset Beach, (1986), pp. 169, 187-191.

Primary Examiner—Brian E. Hearn
Assistant Examiner—Laura M. Holtzman
Attorney, Agent, or Firm—Spencer & Frank

[57] ABSTRACT

A process for growing a thin metallic film of gold or copper selectively on a predetermined area of a substrate. An organic complex or organometallic compound of gold or copper as a starting material is heated to evaporate the same, while a substrate having on the surface thereof a metal or a metallic silicide as a first material and an oxide or a nitride as a second material is heated at a temperature equal to or higher than the decomposition temperature, on the first material, of a vapor of the starting material. The vapor of the evaporated starting material is fed together with a reducing gas onto the heated substrate to selectively grow a thin metallic film of gold or copper only on the surface of the first material.

21 Claims, 9 Drawing Sheets

PROCESS FOR SELECTIVELY GROWING THIN METALLIC FILM OF COPPER OR GOLD

BACKGROUND OF THE INVENTION

1. Field of the Invention

The present invention relates to a process for growing a thin metallic film and an apparatus therefor. Particularly, the present invention relates to a process and an apparatus for growing a thin metallic film, which is well adapted to metallic wiring and interlayer electrical connection of multi-layer wiring in a semiconductor integrated circuit.

2. Description of the Prior Art

A decrease in the size or width of wirings and an increase in the number of layers in a semiconductor integrated circuit have been demanded in keeping with an increase in the scale of integration thereof. A decrease in the size or diameter of holes (contact holes and through-holes) for electrical connection of wirings between multiple layers has also been demanded. Under such circumstances, it has been increasingly difficult to fill such holes with a metal according to a conventional method such as vacuum evaporation and deposition or sputtering. Further, the decrease in the width of the wiring causes an increase in the current density. A conventional aluminum wiring tends to break due to electro-migration when the current density increases, or due to stress migration. Hence, there is a limit to usage of aluminum for wiring material. Tungsten and molybdenum have a high migration resistance but have such high electric resistance that a semiconductor integrated circuit in which wirings of tungsten or molybdenum are used cannot be operated at a high-speed. Accordingly, realization of a method for forming a copper wiring or gold wiring, each of which has a low electric resistance and high migration resistance, by chemical vapor deposition (CVD) is desired. Especially, a selective CVD method by which a hole is selectively filled with copper or gold is strongly desired.

CVD methods for growth of copper are disclosed in U.S. Pat. Nos. 2,833,676 and 2,704,728. In the both methods, copper is deposited on the whole surface of a substrate irrespective of the material of the surface of the substrate. Hence, aforementioned methods are not suitable to fill a fine hole with copper. Many selective growing methods using CVD have been reported as to tungsten, molybdenum and aluminum.

U.S. Pat. No. 3,697,342 discloses a method of selectively growing copper on a substrate according to CVD. In this method, utilization is made of competitive progress of etching of a substrate material along with deposition of a metal on a substrate. That is, a gas or vapor of hexafluoroacetylacetonato-copper as a starting material is introduced together with hydrofluoric acid or sulfur fluoride as an etching gas in to a reaction chamber to simultaneously cause an etching reaction with the substrate made of boron glass, phosphorus glass or soda glass and a copper deposition reaction on a tungsten, chromium, or silicon oxide film formed on the substrate to thereby selectively grow copper on the given portion of the substrate.

According to the conventional selective copper growth method as mentioned above, however, the shape of a substrate is changed as copper deposition proceeds, because utilization is made of competitive progress of etching of the material of the substrate along with the film deposition as described above. This results in large inaccuracies of the dimensions of the resulting structure, which cannot match with fine processing techniques. Furthermore, according to the conventional selective growth method, it is impossible to selectively grow a metal inside through-holes or contact holes to effect electrical connection between wirings in multiple layers.

SUMMARY OF THE INVENTION

An object of the present invention is to provide a process for selectively growing gold or copper on a predetermined area of a substrate.

Another object of the present invention is to provide a process for selectively growing gold or copper, which is well suited to metallic wiring in a semiconductor integrated circuit.

Still another object of the present invention is to provide a process for selectively growing gold or copper, which is well suited to fine metallic wiring adapted to scale up the integration of a semiconductor integrated circuit.

A further object of the present invention is to provide a process for selectively growing gold or copper, which is well suited to interlayer electrical connection of multi-layer wiring in a semiconductor integrated circuit.

A still further object of the present invention is to provide an apparatus for stably effecting the selective growth of gold or copper.

In the first aspect of the present invention, a process for growing a thin metallic film, comprises steps of:

heating an organic complex or organometallic compound of gold or copper as a starting material to evaporate the same;

heating a substrate having on the surface thereof a metal or a metallic silicide as a first material and an oxide or a nitride as a second material to a temperature equal to or higher than the decomposition temperature, on the first material, of a vapor of the starting material; and feeding the vapor of the evaporated starting material being kept at a temperature lower than the decomposition temperature thereof together with a reducing gas onto the heated substrate to selectively grow a thin metallic film of gold or cooper only on the surface of the first material.

Here, the organic complex or organic compound may be at least one member selected from a group consisting of β-diketonato compounds of copper or gold and cyclopentadienyl compounds of copper or gold.

The organic complex or organometallic compound may be at least one member selected from the group consisting of bis-acetylacetonato-copper, bis-hexafluoroacetylacetonato-copper, bis-dipivaloylmethanato-copper, dimethyl-gold-hexafluoroacetylacetonato, cyclopentadienyl-triethylphosphine-copper complex, and dimethyl-gold-acetylacetonato.

The first material may be at least one member selected from the group consisting of aluminum, copper, gold, silicon, titanium, tungsten, chromium, molybdenum, zirconium, tantalum, vanadium and silicides thereof. The second material may be at least one member selected from the group consisting of silicon oxide, silicon nitride and titanium nitride.

The organic complex or organometallic compound may be bis-hexafluoroacetylacetonato-copper, which may be evaporated by heating at a temperature of 50° to 150° C. to form a vapor thereof, which may be then fed through a gas ejecting orifice being heated at a temperature equal to or higher than 50° C. but lower than 200° C. onto the substrate being heated at a temperature of 250° to 450° C.

The organic complex or organometallic compound may be bis-acetylacetonato-copper or dimethyl-gold acetylacetonato, which may be evaporated by heating at a temperature of 100° to 150° C. to form a vapor thereof, which may be then fed through a gas ejecting orifice being heated at a temperature equal to or higher than 100° C. but lower than 200° C. onto the substrate being heated at a temperature of 200° to 450° C.

The organic complex or organometallic compound may be bis-dipivaloylmethanato-copper or dimethyl-gold-hexafluoro-acetylacetonato, which may be evaporated by heating at a temperature of 70° to 180° C. to form a vapor thereof, which may be then fed through a gas ejecting orifice being heated at a temperature equal to or higher than 70° C. but lower than 200° C. onto the substrate being heated at a temperature of 200° to 450° C.

The organic complex or organometallic compound may be cyclopentadienyl-triethylphosphine-copper complex, which may be evaporated by heating at a temperature of 50° to 120° C. to form a vapor thereof, which may be then fed through a gas ejecting orifice being heated at a temperature equal to or higher than 50° C. but lower than 200° C. onto the substrate being heated at a temperature of 200° to 350° C.

In the second aspect of the present invention, a process for growing a thin metallic film, comprises steps of:
 forming an insulating layer made of an oxide or a nitride on a semiconductor substrate;
 forming a hole in a predetermined area of the insulating layer to partially expose the surface of the substrate in an area thereof corresponding to the predetermined area;
 forming on the exposed surface of the substrate a priming layer made of at least one member selected from the group consisting of aluminum, silicon, titanium, tungsten, chromium, molybdenum, zirconium, tantalum, vanadium, and silicides thereof;
 heating an organic complex or organometallic compound of gold or copper as a starting material to evaporate the same;
 heating the substrate to a temperature equal to or higher than the decomposition temperature, on the priming layer, of a vapor of the starting material; and
 feeding the vapor of the evaporated starting material being kept at a temperature lower than the decomposition temperature thereof together with a reducing gas onto the heated substrate to selectively grow a thin metallic film of gold or copper only on the priming layer.

Here, the process may further comprise, after the step of selective growth of gold or copper, the step of:
 forming a metallic layer made of a member selected from the group consisting of aluminum, gold and copper on the remaining insulating layer and the thin metallic film of gold or copper. The priming layer may be formed on the source/drain region of the semiconductor substrate, and the metallic layer may be a wiring layer while the thin metallic film of gold or copper may be a layer serving to electrically connect the source/drain region to the wiring layer.

The semiconductor substrate may be made of silicon. The semiconductor substrate may be made of GaAs. The metallic layer may be formed by a chemical vapor deposition method.

The process may further comprise, after the step of formation of the metallic layer, the steps of:
 forming a second insulating layer on the metallic layer;
 forming a hole in a predetermined area of the second insulating layer to partially expose the metallic layer;
 growing a thin metallic film of gold or copper on the exposed surface of the metallic layer to fill up therewith the hole; and
 forming a second metallic layer on the remaining second insulating layer and the thin metallic film of gold or copper.

Each of the metallic layer and the second metallic layer may be a layer made of a member selected from the group consisting of aluminum, gold and copper, and constituting a middle layer of a sandwich structure comprising the middle layer sandwiched between two layers each made of at least one member selected from the group consisting of aluminum, titanium, chromium, zirconium, tungsten, molybdenum, tantalum, vanadium, and silicides thereof.

In the third aspect of the present invention, a process for growing a thin metallic film, comprises steps of:
 forming a second layer made of an oxide or a nitride on an priming layer serving as a first layer and made of a metal or a metallic silicide;
 forming a hole in a predetermined area of the second layer to partially expose the surface of the priming layer in an area thereof corresponding to the predetermined area;
 heating an organic complex or organometallic compound of gold or copper as a starting material to evaporate the same;
 heating the priming layer together with the second layer to a temperature equal to or higher than the decomposition temperature, on the priming layer, of a vapor of the starting material; and
 feeding the vapor of the evaporated starting material being kept at a temperature lower than the decomposition temperature thereof together with a reducing gas onto the heated priming layer and the second layer to selectively grow a thin metallic film of gold or copper only on the exposed surface of the priming layer.

In the fourth aspect of the present invention, a process for growing a thin metallic film, comprises steps of:
 forming a first insulating layer on a semiconductor substrate;
 forming a hole in a predetermined area of the first insulating layer to partially expose the surface of the substrate;
 forming a polycrystalline silicon layer on the remaining first insulating layer and the exposed surface of the substrate;
 forming on the polycrystalline silicon layer a priming layer made of at least one member selected from the group consisting of aluminum, titanium, tungsten, molybdenum, chromium, zirconium, tantalum, vanadium, and silicides thereof;
 patterning the polycrystalline silicon layer together with the priming layer;
 forming a second insulating layer on the remaining priming layer;

forming a hole in predetermined area of the second insulating layer to partially expose the surface of the remaining priming layer;

heating an organic complex or organometallic compound of gold or copper as a starting material to evaporate the same;

heating the substrate to a temperature equal to or higher than the decomposition temperature, on the remaining priming layer, of a vapor of the starting material; and feeding the vapor of the evaporated starting material being kept at a temperature lower than the decomposition temperature thereof together with a reducing gas onto the heated substrate to selectively grow a thin metallic film of gold or copper only on the exposed surface of the remaining priming layer.

Here, the priming layer may be formed on the polycrystalline silicon layer with a layer of an lectroconductive metallic nitride formed therebetween.

The priming layer may be formed on the polycrystalline silicon layer with a layer of an electroconductive metallic nitride and a layer of a metallic silicide formed therebetween.

In the fifth aspect of the present invention, a process for growing a thin metallic film, comprises steps of:

forming a first insulating layer on a semiconductor substrate;

forming a hole in a predetermined area of the first insulating layer to partially expose the surface of the substrate;

forming a polycrystalline silicon layer on the remaining first insulating layer and the exposed surface of the substrate;

patterning the polycrystalline silicon layer;

forming a second insulating layer on the remaining polycrystalline silicon layer;

forming a hole in a predetermined area of the second insulating layer to partially expose the surface of the remaining polycrystalline silicon layer;

forming on the exposed surface of the remaining polycrystalline silicon layer a priming layer made of at least one member selected from the group consisting of aluminum, titanium, tungsten, molybdenum, chromium, zirconium, tantalum, vanadium, and silicides thereof to fill up therewith the hole;

heating an organic complex or organometallic compound of gold or copper as a starting material to evaporate the same;

heating the substrate to a temperature equal to or higher than the decomposition temperature, on the priming layer, of a vapor of the starting material; and feeding the vapor of the evaporated starting material being kept at a temperature lower than the decomposition temperature thereof together with a reducing gas onto the heated substrate to selectively grow a thin metallic film of gold or copper only on the surface of the priming layer.

In the sixth aspect of the present invention, an apparatus for growing a thin metallic film, comprises:

a reaction chamber capable of being evacuated;

substrate holding means for holding and heating a substrate, the substrate holding means being provided in the reaction chamber;

a starting material container for containing a starting material;

heating means for evaporating the starting material in the starting material container;

gas ejecting means having gas ejecting orifices for ejecting a vapor of the starting material together with a reducing gas, the gas ejecting means being connected to the starting material container, the gas ejecting orifices being provided in a face of the gas ejecting means confronted with the substrate holding means inside the reaction chamber; and heat exchanging means for circulating a heat exchange medium to the proximity of the gas ejecting orifices of the gas ejecting means.

The above and other objects, effects, features, and advantages of the present invention will become more apparent from the following description of embodiments thereof, taken in conjunction with accompanying drawings.

DETAILED DESCRIPTION OF THE PREFERRED EMBODIMENTS

Examples of the present invention will now be described while referring to the accompanying drawings.

Figure 1:
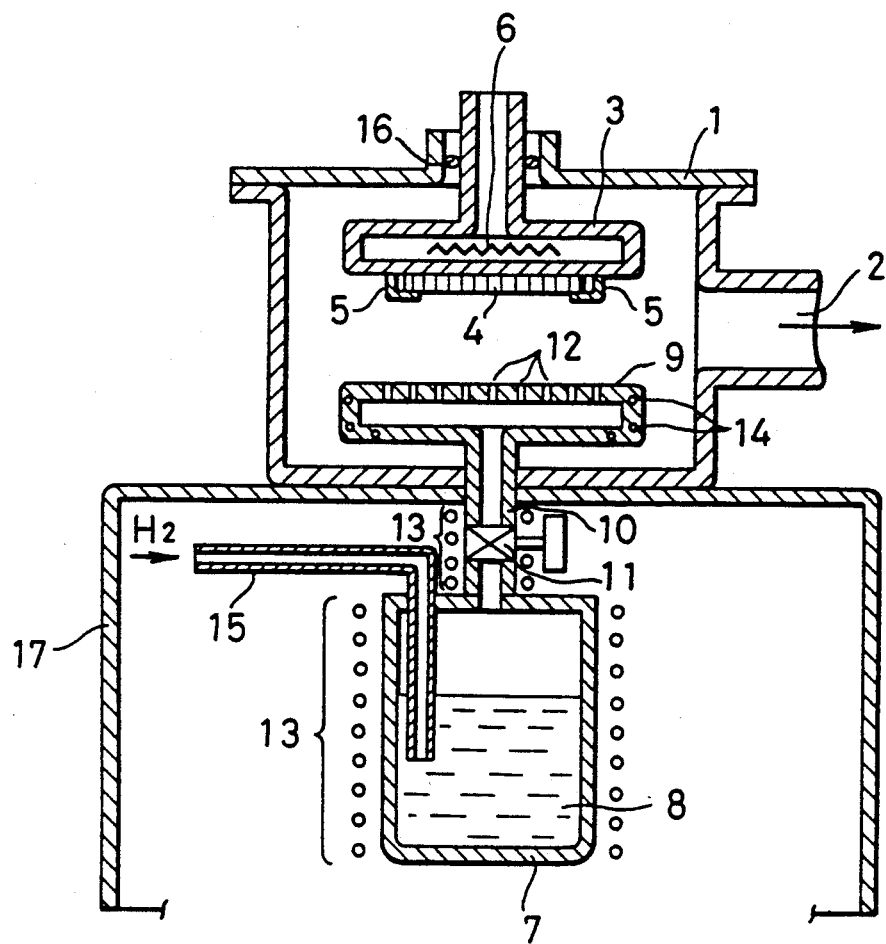
FIG. 1 is a schematic cross-sectional view of an example of the apparatus for growing a thin metallic film, which is used to carry out the process of the present invention.
Figure 2:
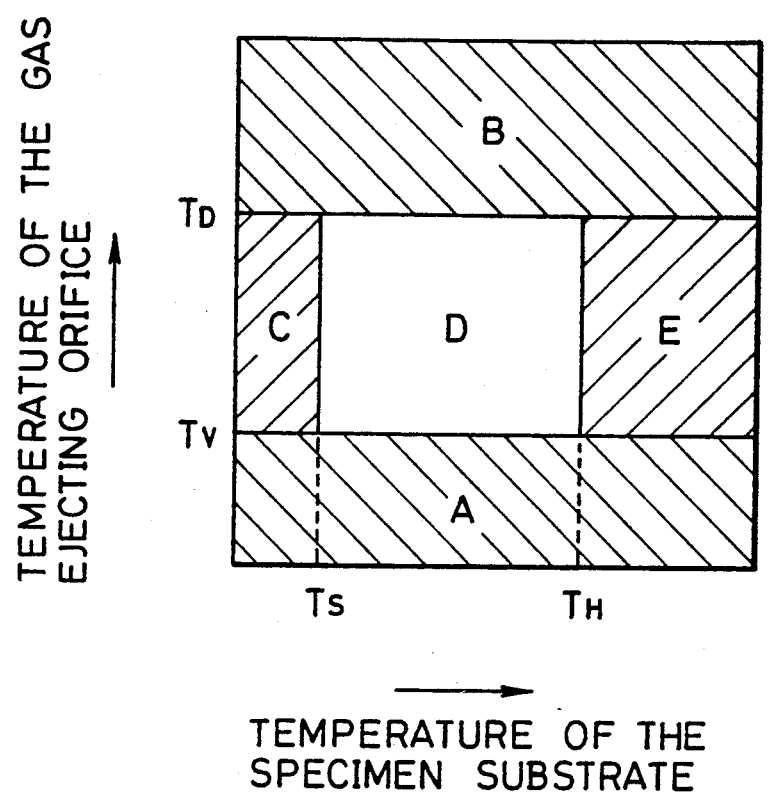
FIG. 2 is a model diagram showing conditions under which selective growth is effected according to the present invention.

FIG. 1 shows an example of an apparatus for selectively growing a thin gold or copper film on a predetermined area or areas of the surface of a specimen substrate. This apparatus is analogous to a common reduced-pressure CVD apparatus. A reaction chamber 1 can be evacuated through an evacuation aperture 2 with a pumping system not shown in FIG. 1. A suspector or specimen substrate holder 3 for holding a specimen substrate 4 with plate springs 5 is provided in the reaction chamber 1. A heater 6 is built in the specimen substrate holder 3, and can heat the specimen substrate 4 to a predetermined temperature. A starting material container 7 for containing a starting material 8, consisting of an organic complex or organometallic compound of gold or copper, is provided on the outside of the reaction chamber 1. A gas ejecting panel 9 confronted with the specimen substrate holder 3 inside the reaction chamber 1 is connected through a pipe 10 and a valve 11 to the starting material container 7. The gas ejecting panel 9 has numerous fine gas ejecting orifices 12. The starting material container 7, the pipe 10, and the valve 11 are heated to a predetermined temperature with a heater 13, while the gas ejecting panel 9 is heated to a predetermined temperature with a heater 14 built therein. Alternatively, starting material container 7 may be set within a thermostat. A reducing carrier gas such as hydrogen gas is introduced through a piping 15 into the starting material container 7. Reference numeral 16 denotes an O-ring and 17 denotes a stand. A vapor of the starting material 8 evaporated by heating in the starting material container 7 is ejected together with the hydrogen gas through the gas ejecting orifices 12 and fed onto the surface of the specimen substrate 4 held by the specimen substrate holder 3. It was found through a number of experiments that the vapor of the starting material 8 is susceptible to the material of the surface of the specimen substrate 4 in such a way that it is decomposed on a specific material selected from among aluminum, titanium, chromium, zirconium, tungsten, molybdenum, tantalum, vanadium, and silicides thereof to grow thereon gold or copper, while it is not decomposed on other specific material selected from among metallic oxides, such as silicon oxide, and metallic nitrides, such as silicon nitride and titanium nitride, to fail to grow thereon gold or copper. This is attributable to a difference in the catalytic action on the reductive decomposition reaction of the vapor of the starting material 8 with the reducing gas between the two kinds of materials. Accordingly, choice of the former kind of material as the material of the surface of the specimen substrate can realize growth of gold or copper on the whole surface of the specimen substrate, while the use of the former kind of material in a predetermined area or areas of the surface of the specimen substrate and the latter kind of material in the other area of the surface of the specimen substrate can realize selective growth of gold or copper only on the predetermined area of the surface of the specimen substrate. In effecting such selective growth, it is important to appropriately set the temperatures of the gas ejecting orifices 12, that is the gas injecting panel 9, and the specimen substrate 4. FIG. 2 typically shows the variation of the state of growth of gold or copper with the temperatures of the gas ejecting orifice and the specimen substrate. In the region A wherein the temperature of the gas ejecting orifice 12 is equal to or lower than the solidification and precipitation temperature Tv of the starting material 8, the vapor of the evaporated starting material is solidified on the gas ejecting panel 9 to fail to be ejected therethrough in a gaseous form. Therefore, this region is a temperature range wherein no growth of gold or copper occurs irrespective of the temperature of the specimen substrate 4. In the region B wherein the temperature of the gas ejecting orifice 12 is equal to or higher than the decomposition temperature Td of the vapor of the starting material 8, when passing through the orifices 12 the vapor of the starting material 8 is decomposed, and gold or copper in an atomic or molecular form then reaches the surface of the specimen substrate 4 to grow on the whole surface of the specimen substrate 4 irrespective of the materials of the surface of the specimen substrate 4. Therefore, the temperature of the gas ejecting orifices 12 must be not only higher than the solidification and precipitation temperature Tv of the starting material 8 but also lower than the decomposition temperature Td of the vapor of the evaporated starting material 8. On the other hand, when the temperature of the specimen substrate 4 is lower than the decomposition temperature Ts of the vapor of the starting material 8 on the specific material on which gold or copper is to be selectively grown, the vapor of the starting material fed onto the surface of the specimen substrate 4 does not decompose to fail to grow thereon gold or copper. The region C corresponds to such a temperature range. Only in the region D wherein the temperature of the gas ejecting orifices 12 or that of the gas ejecting panel 9 is higher than the solidification and precipitation temperature Tv of an organic complex or organometallic compound of gold or copper as the starting material 8 and lower than the decomposition temperature Td thereof while the temperature of the specimen substrate 4 is at least the decomposition temperature Ts of the vapor of the starting material when it presents on the specific material on which gold or copper is to be selectively grown, gold or copper can be grown on the predetermined area of the surface cf the specimen substrate 4. Additionally stated, if the gas ejecting panel 9 is made of a metal such as aluminum or titanium, the above-mentioned two decomposition temperatures Td and Ts are substantially equal to each other. In the region E wherein the temperature of the specimen substrate 4 exceeds the Th and is too high, crystal grains of gold or copper selectively grown on the specimen substrate 4 unfavorably become coarse to provide a rough surface thereof. The value of Th is not definite. The temperature of the specimen substrate 4 should be higher than the Ts, but is preferably not higher than the Ts plus about 200° C. Particularly when the process of the present invention is incorporated into a process for producing a semiconductor integrated circuit, it is not preferable to raise the temperature of the specimen substrate to a high degree.

As a starting material, $\beta$-diketonato compounds of copper or gold such as bis-acetylacetonato-copper, bis-hexafluoroacetylacetonato-copper, bis-dipivaloylmethanato-copper, dimethyl-gold-hexafluoroacetylacetonato or dimethyl-gold-acetylacetonato or cyclopentadienyl compounds of copper of gold such as cyclopentadienyl-triethylphosphine-copper or a mixture thereof can be used.

EXAMPLE 5

An experiment was carried out, wherein bis-hexafluoroacetylacetonato-copper was used as a starting material for selective growth of copper. Bis-hexafluoroacetylacetonato-copper contained in the starting material container 7 was heated to 70° C., and then ejected together with hydrogen gas as a carrier gas from the gas ejecting orifices 12 of the gas ejecting panel 9 to be fed onto the surface of a specimen substrate 4. When the temperature of the gas ejecting orifices 12, the temperature of the specimen substrate 4, the flow rate of the hydrogen gas, and the pressure inside the reaction chamber 1 were set to be 150° C., 350° C., 100 ml/min, and 1,000 Pa, respectively, a deposition reaction occurred neither on metallic oxides such as silicon oxide nor on metallic nitrides such as silicon nitride and titanium nitride, while copper grew at a rate of about 100 Å/min on metals such as aluminum, titanium, tungsten, chromium, molybdenum, zirconium tantalum and vanadium as well as on metallic silicides thereof. No etching was observed on the surfaces of the materials such as silicon oxide, silicon nitride and titanium nitride, on which no deposition of copper occurred. When growth of copper was effected on a metallic oxide film and a metallic nitride film each having at least one of the above-mentioned metals and metallic silicides located on a given area thereof under the same conditions as mentioned above, copper selectively grew only on the metal or metallic silicide at a rate of about 100 Å/min. This selective growth was genuine selective growth not involving etching of the metallic oxide or nitride film.

When the temperature of the starting material container, the temperature of the gas ejecting orifice, the temperature of the specimen substrate, the flow rate of hydrogen gas, and the pressure inside the reaction chamber were in the ranges of 50° to 150° C., 50° to 200° C., 250° to 450° C., 100 to 1,000 ml/min, and 200 to 5,000 Pa, respectively, selective growth of copper could be effected. When the temperature of the gas ejecting orifice exceeded 200° C., copper deposited on the whole surface of a specimen substrate.

While the above-mentioned ranges of conditions were determined when use was made of an apparatus comprising a cylindrical reaction chamber having a diameter of 30 cm, a specimen substrate holder having a diameter of 20 cm, a gas ejecting panel having a diameter of 20 cm and including numerous orifices each having a diameter of 1 mm, a distance between the specimen holder and the gas ejecting panel being 5 cm, and a starting material container capable of containing 150 g of a starting material, the flow rate of a gas and the pressure inside a reaction chamber are variable depending on the shape of an apparatus just as in other semiconductor processes.

An analogous reaction can be carried out by setting not only the temperature of a substrate in the range of 200° to 450° C. but also the temperature of the starting material container in the range of 100° to 150° C. in the case of bis-acetylacetonato-copper as well as dimethyl goldacetylacetona and in the range of 70° to 180° C. in the case of bis-dipivaloylmethanato-copper as well as dimethyl-gold-hexafluoro-acetylacetonato. In the case of cyclopentadienyl-triethylphosphine-copper complex, an analogous reaction can be carried out by setting the temperature of the starting material container in the range of 50° to 120° C. the temperature of a substrate in the range of 200° to 350° C. and the pressure inside the reaction chamber in the range of 500 to 5,000 Pa while using hydrogen gas as a carrier gas to be introduced into the system. The above-mentioned starting materials may also be used in mixture.

EXAMPLE 2

Figure 3A:
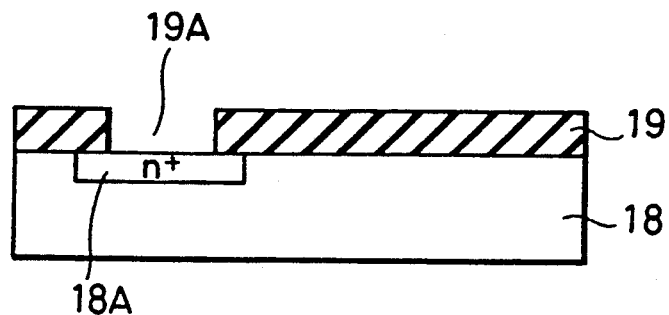
FIGS. 3A to 3C are cross-sectional views of structures produced in major steps of an example of the process of the present invention, according to which a wiring guide for electrical connection drawn from a semiconductor substrate is formed.
Figure 3B:
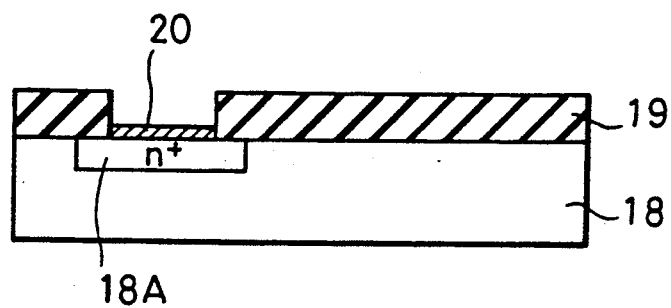
Figure 3C:
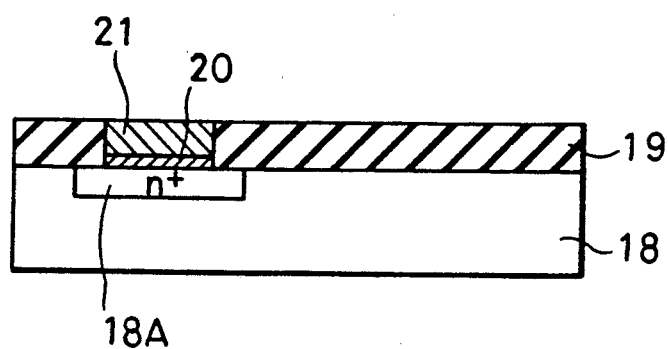

FIGS. 3A to 3C show an example wherein selective metal growth according to the present invention is applied to formation of a wiring guide for electrical connection drawn from a semiconductor substrate. This example relates to formation of a wiring guide for electrical connection drawn from the source/drain of a MOSFET.

An insulating layer 19 such as a silicon oxide film is formed on a semiconductor substrate 18 such as a silicon substrate. A hole 19A reaching the surface of the semiconductor substrate 18 is formed in the insulating layer 19 by a common lithographic method. Subsequently, doping is effected with a dopant to form a source/drain 18A (FIG. 3A). Subsequently, as shown in FIG. 3B, a diffusion barrier layer 20 made of tungsten, molybdenum, titanium, zirconium, chromium, tantalum, vanadium or a silicide thereof is selectively formed on the exposed surface of the doped semiconductor substrate 18A (source/drain) by a known method such as sputtering. Thereafter, as shown in FIG. 3C, gold or copper 21 is selectively deposited on the diffusion barrier layer 20 according to the process as described in Example 1 to fill up therewith the hole. In this manner, electrical connection drawn from the predetermined position of the semiconductor substrate is established through the gold or copper 21 grown as a wiring guide. The diffusion barrier layer 20 not only serves as a priming layer to allow gold or copper to selectively grow thereon, but also plays a role of preventing the gold or copper from diffusing into the source/drain.

EXAMPLE 3

FIGS. 4A to 4D show a process for producing a multi-layer wiring structure by utilizing the process for growing a thin metallic film according to the present invention, as well as a multi-layer wiring structure produced thereby.

Figure 4A:
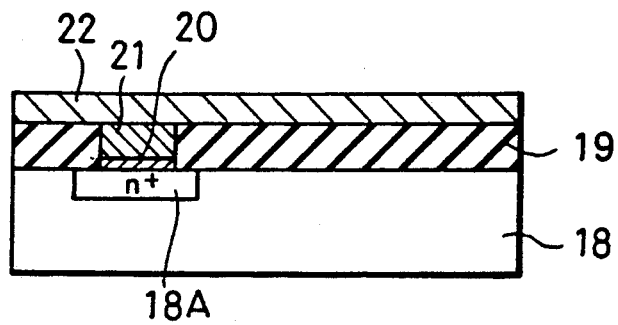
FIGS. 4A to 4D are cross-sectional views of structures produced in major steps of another example of the process of the present invention, according to which multi-layer wirings with electrical connection therebetween are formed.
Figure 4B:
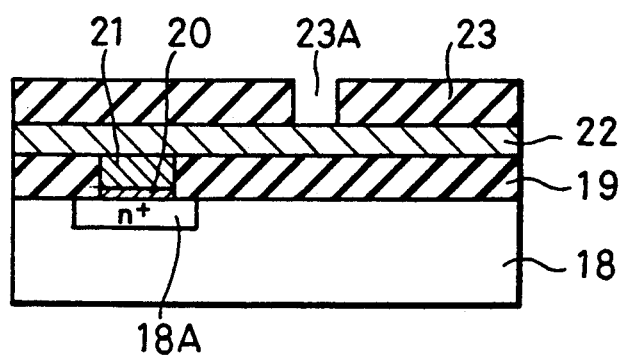
Figure 4C:
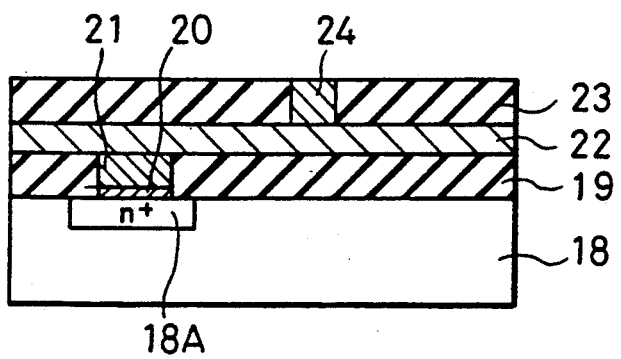
Figure 4D:
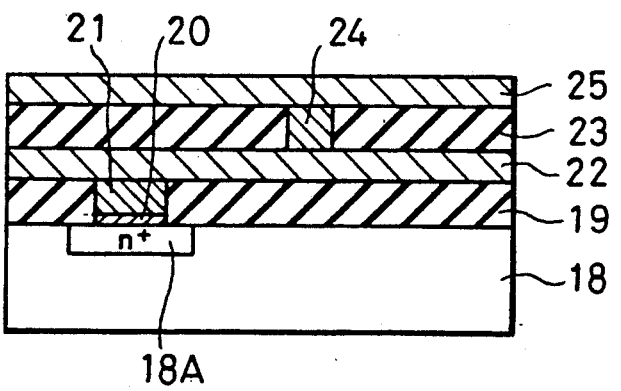

A first wiring layer 22 of aluminum, copper or gold is formed on the insulating layer 19 and the gold or copper 21 in the hole 19A on the semiconductor substrate 18 constituting the structure of FIG. 3C which is produced through the steps of FIG. 3A to 3C (FIG. 4A). Silicon oxide is deposited as an insulating interlayer 23 on the first wiring layer 22 and then etched in part to form therein a hole 23A (FIG. 4B) according to a common lithographic process. Subsequently, copper or gold 24 is selectively grown inside the hole 23A, that is, on the exposed surface of the first wiring layer 22, according to the process as described in Example 1 to fill up therewith the hole 23A to thereby planalize the upper surface (FIG. 4C). Finally, as shown in FIG. 4D, a second wiring layer 25 of aluminum, copper or gold is formed by a common method. In this manner, electrical connection of source/drain 18A—metallic layer 21—wiring layer 22—metallic layer 24—wiring layer 25 is established to complete multi-layer wiring.

Additionally stated, the first wiring layer 22 and the second wiring layer 25 can be formed using the apparatus as shown in FIG. 1 according to a CVD method. Specifically, an organic complex or organometallic compound of aluminum, copper or gold as a starting material is evaporated to form a vapor of the starting material, which is then ejected from the gas ejecting orifices heated at a temperature equal to or higher than the decomposition temperature of the starting material to grow aluminum, copper or gold on the whole surface including the surfaces of insulating layer 19 (23) and the selectively grown gold or copper 21 (24) to thereby form a film of aluminum, copper or gold, which may then be subjected to predetermined patterning if necessary to form a wiring layer.

EXAMPLE 4

FIGS. 5A to 5D show an example wherein the process for growing a thin metallic film according to the present invention is used for electrical connection of a first wiring layer made of polycrystalline silicon with a second wiring layer made of a metal through an insulating interlayer sandwiched between the first and second wiring layers.

Figure 5A:
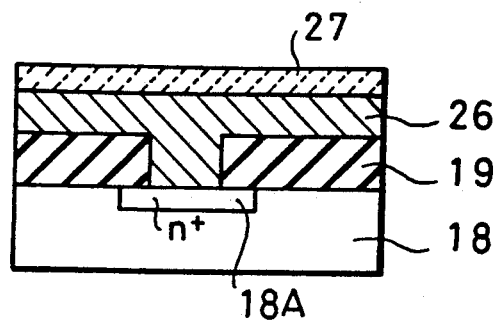
FIGS. 5A to 5D are cross-sectional views of structures produced in major steps of still another example of the process of the present invention, according to which multi-layer wirings with electrical connection therebetween are formed.

As shown in FIG. 5A, polycrystalline silicon 26 is deposited on the upper surface including the surface of a silicon oxide layer 19 and that of the doped substrate 18A for the purpose of forming an electrode for the source/drain 18A of a semiconductor substrate 18. Subsequently, a priming layer 27 made of at least one material selected from among titanium, tungsten, chromium, molybdenum, zirconium, tantalum, vanadium and silicides thereof is formed on the resulting polycrystalline silicon layer 26 according to a common method.

Figure 5B:
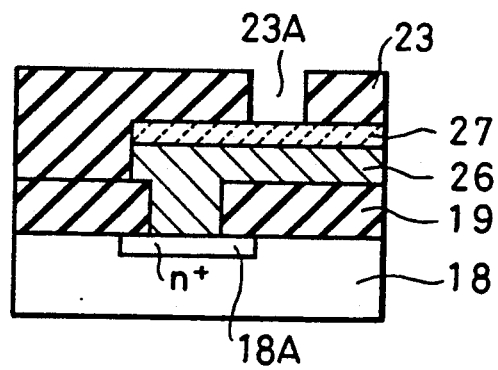

Subsequently, as shown in FIG. 5B, the polycrystalline silicon layer 26 and the priming layer 27 are patterned into the form of an electrode, followed by deposition of an insulating layer 23, in which a hole 23A is then formed.

Figure 5C:
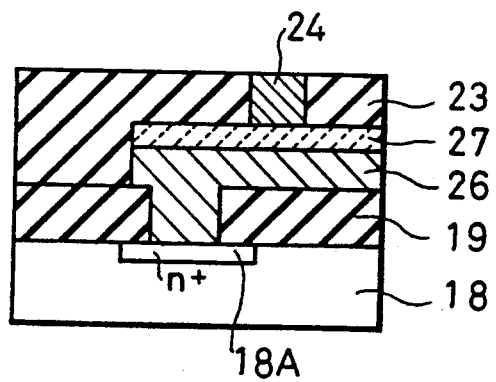

Thereafter, as shown in FIG. 5C, copper or gold 24 is selectively grown inside the hole 23A according to the process as described in Example 1 to fill up therewith the hole 23A to thereby planarize the upper surface.

Figure 5D:
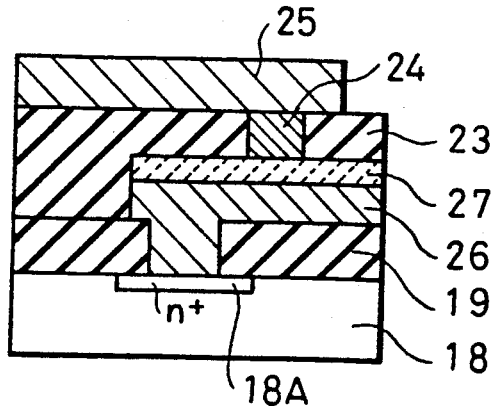

Finally, as shown in FIG. 5D, a second wiring layer 25 made of a metal such as aluminum is formed on the above-mentioned upper surface to complete multi-layer wiring.

Figure 6:
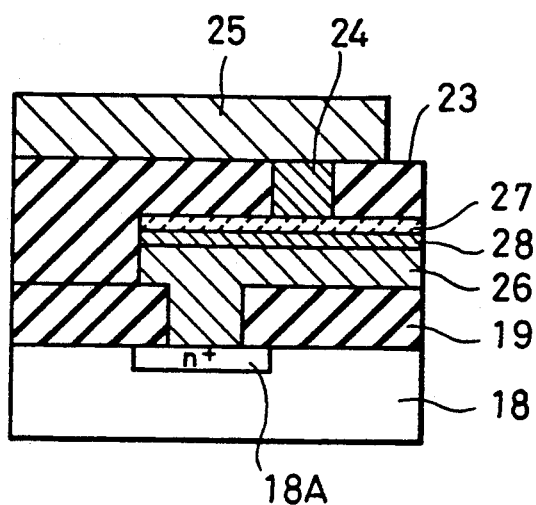
FIGS. 6 and 7 are cross-sectional views of respective multi-layer wiring structures produced according to the process of the present invention.
Figure 7:
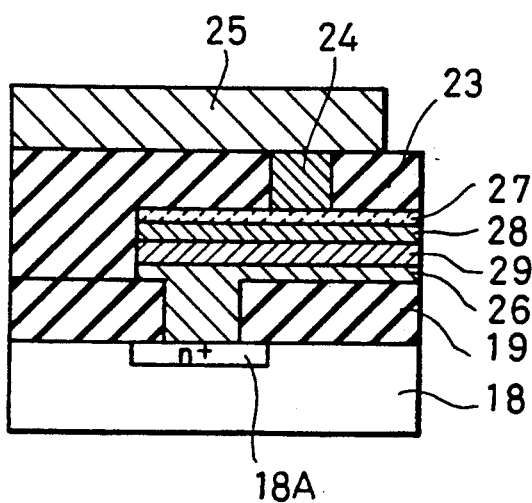

FIGS. 6 and 7 show other types of multi-layer wiring structures produced by the process of the present invention.

The structure of FIG. 6 is characterized in that a layer 28 of an electroconductive metallic nitride such as titanium nitride is sandwiched between a polycrystalline silicon layer 26 and a metallic layer 27 just as shown in FIG. 5D to prevent gold or copper 24 from diffusing downwardly to thereby improve the reliability of the structure. The metallic nitride layer 28 is made by depositing a metal such as titanium on the polycrystalline silicon and nitriding it according to the common method.

Figure 8A:
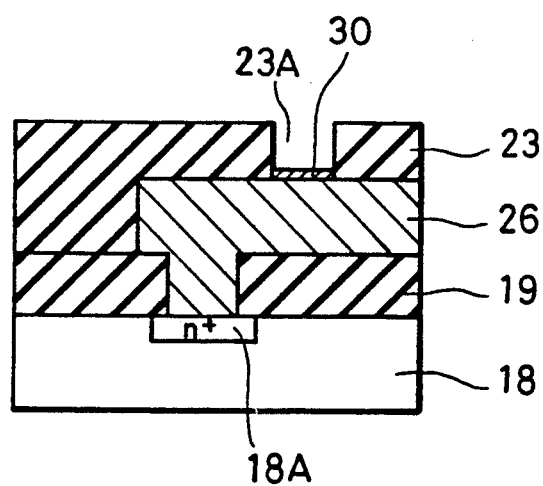
FIGS. 8A and 8B are cross-sectional views of structures produced in major steps of a further example of the process of the present invention, according to which multi-layer wirings with electrical connection therebetween are formed.
Figure 8B:
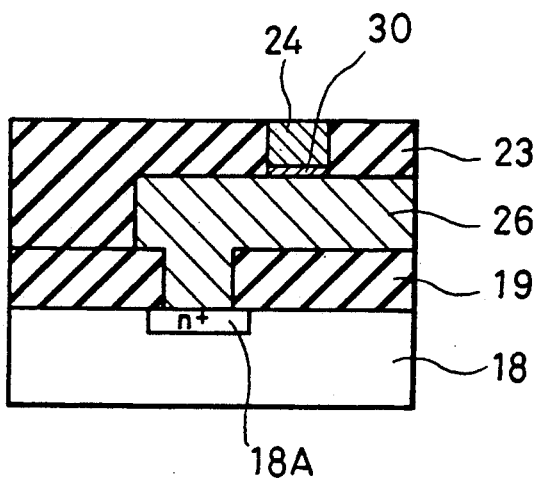

The structure of FIG. 7 is characterized in that a surface portion of a polycrystalline silicon layer 26 as shown in FIG. 6 is converted into a metallic silicide layer 29 by a common alloying method to lower the electric resistance of the structure.

Where the polycrystalline silicon layer 26 and the priming layer 27 conducive to the selective growth cannot be simultaneously patterned in the step as shown in FIG. 5B, the following procedure may be taken instead. As shown in FIG. 8A, a polycrystalline silicon layer 26 is patterned into the form of an electrode, followed by formation thereon of an insulating interlayer 23, in which a hole 23A is then formed. Thereafter, a priming layer 30 made of aluminum, titanium, tungsten, molybdenum, chromium, zirconium, tantalum, vanadium or a silicide thereof is formed on the exposed surface of the remaining polycrystalline silicon layer 26 by a known method. Thereafter, as shown in FIG. 8B, copper or gold 24 is selectively grown inside the remaining hole 23A according to the process as described in Example 1.

EXAMPLE 5

Figure 9:
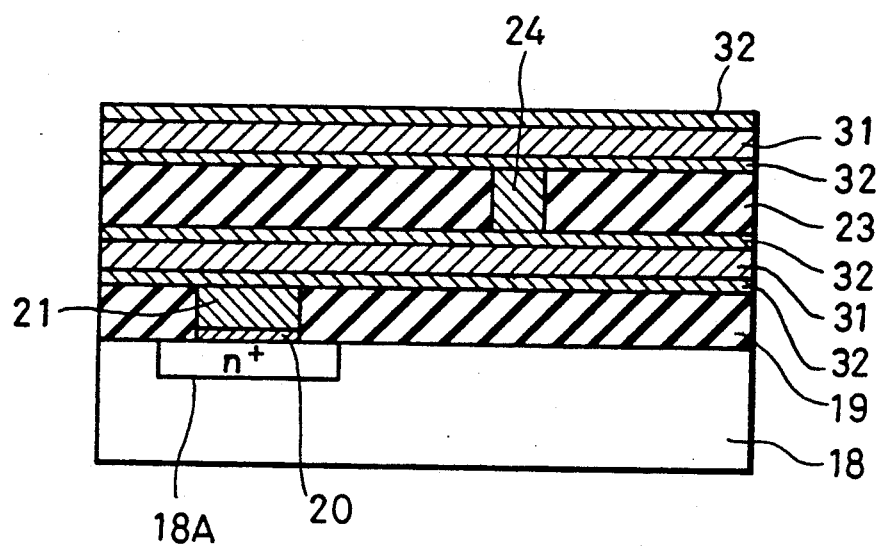
FIG. 9 is a cross-sectional view of another multi-layer wiring structure produced according to the process of the present invention.

FIG. 9 shows a multi-layer wiring structure which is further improved in performance over the wiring structure of FIG. 4D. A difference of the structure of FIG. 9 from that of FIG. 4D is that wiring layers 31 of copper, gold or aluminum are each sandwiched between layers 32 of aluminum, titanium, chromium, zirconium, tungsten, molybdenum, tantalum, vanadium or a silicide thereof. The layers 31 and 32 are formed by a CVD method. Electrical connection between the wiring layers is made using copper or gold 24 selectively grown according to the aforementioned process of the present invention.

Where aluminum is used as a wiring material, direct contact thereof with selectively grown gold or copper 24 forms an alloy having a high electric resistance through a heat treatment. The formation of such an alloy can be prevented by using at least one of titanium, chromium, zirconium, tungsten, molybdenum, tantalum, vanadium and silicides thereof as the material of the layers 32 because the above-mentioned materials can prevent upward and downward diffusion of aluminum.

Where copper or gold is used as a wiring material, a decrease in electric resistance and an improvement in migration resistance can be achieved, and hence enables any one of aluminum, titanium, chromium, zirconium, tungsten, molybdenum, tantalum, vanadium and silicides thereof to be used as the material of the priming layers conducive to the selective growth of copper or gold 24. In this case, further, the priming layers 32 serve to improve the adhesion of the wiring layers 31 to an insulating interlayer 23 and to prevent the corrosion of copper if used.

While only a portion of a MOSFET around the source/drain region thereof is shown in every one of FIGS. 3A to 3C, 4A to 4D, 5A to 5D, 6, 7, 8A, 8B, and 9, the applicability of the present invention is not limited thereto and it will be apparent that the present invention is widely applicable to formation of wirings in semiconductor devices. As for the semiconductor substrate as well, the process of the present invention is not limited to a combination with a silicon substrate, but can be used in combination with compound semiconductor substrates including GaAs substrates.

Figure 10:
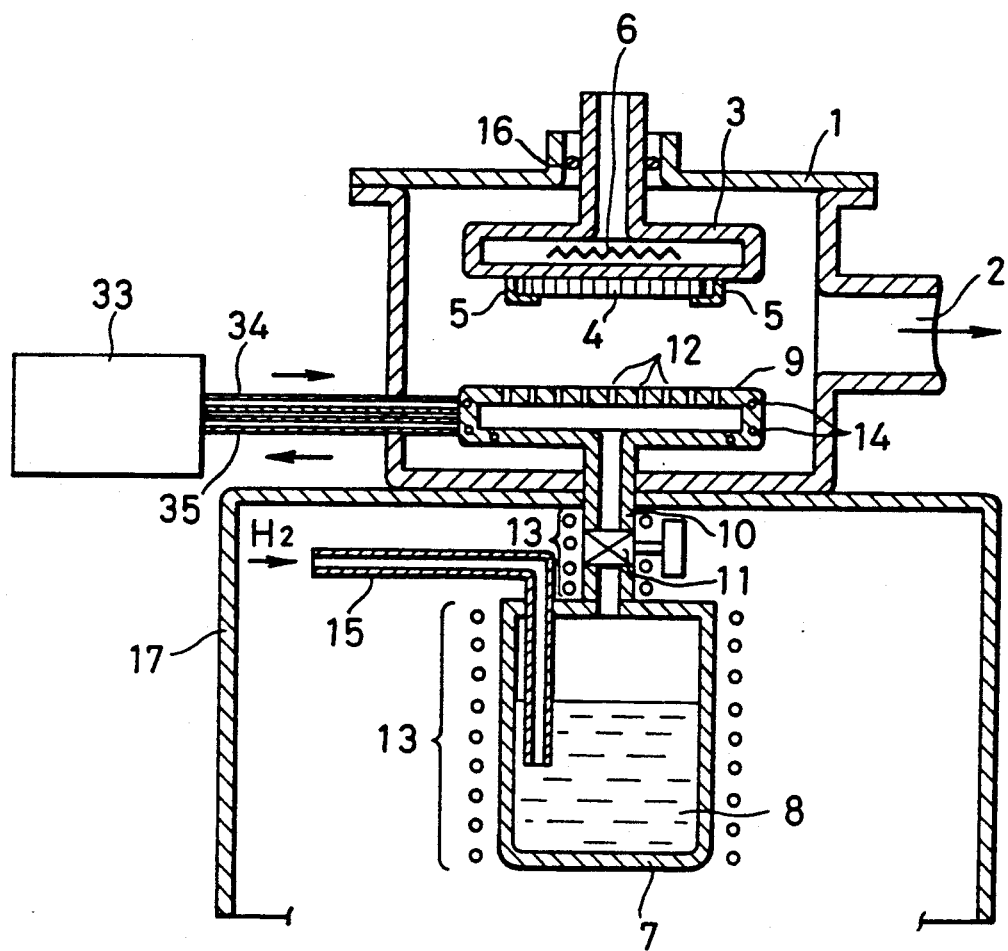
FIG. 10 is a schematic cross-sectional view of an example of the apparatus for growing a thin metallic film according to the present invention.

FIG. 10 shows an embodiment of the apparatus for selective metal growth according to the present invention. A heat exchange medium such as a silicone oil is circulated from a heat exchanger 33 through pipings 34 and 35 to the proximity of the gas ejecting orifices 12 of a gas ejecting panel 9. The temperature of the gas ejecting panel 9 confronted with a heated specimen substrate 4 is liable to vary by radiation or heat conduction from the specimen substrate 4. However, the circulation of the heat exchange medium heated at a constant temperature of, for example, 150° C. with the heat exchanger 33 shown in FIG. 10 can keep the temperature of the gas ejecting orifices 12 constant to enable gold or copper to be stably grown for a long period of time.

As described above, according to the present invention, a thin film of gold or copper can be formed in self-alignment with the aid of the material of a priming layer different from that of other layer therearound. Accordingly, the process of the present invention can be used to fill up fine, deep contact holes and/or through holes with a metal in wiring of a semiconductor device, and hence can realize an increase in the scale of integration of wiring patterns as well as a decrease in the capacity thereof. Further, the process of the present invention can contribute to planarization of contact portions. Furthermore, according to the present invention, a low electric resistance can be provided as compared with those of tungsten and molybdenum as used in conventional selective growth, a high speed can be realized with minimizing the time-delay attributed to wirings, and multi-layer wiring is made easily possible by selective growth of gold or copper on aluminum or titanium, on which the selective growth of aluminum is difficult, to thereby enable the scale of integration of a semiconductor device to be raised. As described above, the utilization of the present invention can realize an increase in the scale of integration of a semiconductor device as well as speedup thereof.

Other embodiments will be apparent to those skilled in the art from consideration of the specification and practice of the invention disclosed herein. It is intended that the specification and examples be considered as exemplary only, with a true scope of the invention being indicated by the following claims.

What is claimed is:

1. A process for growing a thin metallic film, comprising the steps of:
   maintaining a substrate, having on the surface thereof a first material consisting of metal or a metallic silicide and a second material selected from the group consisting of silicon oxide, silicon nitride and titanium nitride, under a reduced pressure;
   heating an organic complex or organometallic compound of gold or copper as a starting material to evaporate the same;
   heating said substrate to a temperature equal to or higher than the decomposition temperature, on said first material, of a vapor of said evaporated starting material; and
   feeding a gas stream consisting essentially of the vapor of said evaporated starting material being kept at a temperature lower than the decomposition temperature thereof and a reducing gas onto said heated substrate to selectively grow a thin metallic film of gold or copper only on the surface of said first material.

2. A process for growing a thin metallic film as claimed in claim 1, wherein said organic complex or organic compound is at least one member selected from a group consisting of β-diketonato compounds of copper or gold and cyclopentadienyl compounds of copper or gold.

3. A process for growing a thin metallic film as claimed in claim 2, wherein said organic complex or organometallic compound is at least one member selected from the group consisting of bis-acetylacetonato-copper, bis-hexafluoroacetylacetonato-copper, bis-dipivaloylmethanato-copper, dimethyl-gold-hexafluoro-acetylacetonato, cyclopentadienyl-triethylphosphine-copper complex, and dimethyl-gold-acetylacetonato.

4. A process for growing a thin metallic film as claimed in claim 1, wherein said first material is at least one member selected from the group consisting of aluminum, copper, gold, silicon, titanium, tungsten, chromium, molybdenum, zirconium, tantalum, vanadium and silicides thereof.

5. A process for growing a thin metallic film as claimed in claim 3, wherein said organic complex or organometallic compound is bis-hexafluoroacetylacetonato-copper, which is evaporated by heating at a temperature of 50° to 150° C. to form a vapor thereof, which is then fed through a gas ejecting orifice being heated at a temperature equal to or higher than 50° C. but lower than 200° C. onto said substrate being heated at a temperature of 250° to 450° C.

6. A process for growing a thin metallic film as claimed in claim 3, wherein said organic complex or organometallic compound is bis-acetylacetonato-copper or dimethyl-gold-acetylacetonato, which is evaporated by heating at a temperature of 100° to 150° C. to form a vapor thereof, which is then fed through a gas ejecting orifice being heated at a temperature equal to or higher than 100° C. but lower than 200° C. onto said substrate being heated at a temperature of 200° to 450° C.

7. A process for growing a thin metallic film, comprising the steps of:
   heating a starting material consisting of bis-dipivaloylmethanato-copper or dimetyl-gold-hexafluoroacetylaacetonato at a temperature of 70° to 180° C. to evaporate the same;
   heating a substrate having on the surface thereof a metal or a metallic silicide as a first material and an oxide or a nitride as a second material to a temperature of 200 ° to 450° C;
   feeding the vapor of said evaporated starting material through a gas ejecting orifice being heated at a temperature equal to or higher than 70° C. but lower than 200° C. together with a reducing gas onto said heated substrate to selectively grow a thin metallic film of gold or copper only on the surface of said first material.

8. A process for growing a thin metallic film comprising the steps of:
   heating a starting material consisting of cyclopentadienyl-triethylphosphine-copper at a temperature of 50° to 120° C. to evaporate the same;
   heating a substrate having on the surface thereof a metal or a metallic silicide as a first material and an oxide or a nitride as a second material to a temperature of 200° to 350° C;
   feeding the vapor of said evaporated starting material through a gas ejecting orifice being heated at a temperature equal to or higher than 50° C. but lower than 200° C. together with a reducing gas onto said heated substrate to selectively grow a thin metallic film of copper only on the surface of said first material.

9. A process for growing a thin metallic film, comprising steps of:
   forming an insulating layer made of an oxide or a nitride on a semiconductor substrate;
   forming a hole in a predetermined area of said insulating layer to partially expose the surface of said substrate in an area thereof corresponding to said predetermined area;
   forming on the exposed surface of said substrate a priming layer made of at least one member selected from the group consisting of aluminum, silicon, titanium, tungsten, chromium, molybdenum, zirconium, tantalum, vanadium, and silicides thereof;
   heating an organic complex or organometallic compound of gold or copper as a starting material to evaporate the same;
   heating said substrate to a temperature equal to or higher than the decomposition temperature, on said priming layer, of a vapor of said starting material; and
   feeding the vapor of said evaporated starting material being kept at a temperature lower than the decomposition temperature thereof together with a reducing gas onto said heated substrate to selectively grow a thin metallic film of gold or copper only on said priming layer.

10. A process for growing a thin metallic film as claimed in claim 9, further comprises, after said step of selective growth of gold or copper, the step of:

forming a metallic layer made of a member selected from the group consisting of aluminum, gold and copper on the remaining insulating layer and said thin metallic film of gold or copper.

11. A process for growing a thin metallic film as claimed in claim 10, wherein said priming layer is formed on the source/drain region of said semiconductor substrate, and wherein said metallic layer is a wiring layer while said thin metallic film of gold or copper is a layer serving to electrically connect said source/drain region to said wiring layer.

12. A process for growing a thin metallic film as claimed in claim 11, wherein said semiconductor substrate is made of silicon.

13. A process for growing a thin metallic film as claimed in claim 11, wherein said semiconductor substrate is made of GaAs.

14. A process for growing a thin metallic film as claimed in claim 11, wherein said metallic layer is formed by a chemical vapor deposition method.

15. A process for growing a thin metallic film as claimed in claim 10, further comprises, after said step of formation of said metallic layer, the steps of:

forming a second insulating layer on said metallic layer;

forming a hole in a predetermined area of said second insulating layer to partially expose said metallic layer;

growing a thin metallic film of gold or copper on the exposed surface of said metallic layer to fill up therewith said hole; and forming a second metallic layer on the remaining second insulating layer and the thin metallic film of gold or copper.

16. A process for growing a thin metallic film as claimed in claim 15, wherein each of said metallic layer and said second metallic layer is a layer made of a member selected from the group consisting of aluminum, gold and copper, and constituting a middle layer of a sandwich structure comprising said middle layer sandwiched between two layers each made of at least one member selected from the group consisting of aluminum, titanium, chromium, zirconium, tungsten, molybdenum, tantalum, vanadium, and silicides thereof.

17. A process for growing a thin metallic film, comprising steps of:

forming a second layer made of an oxide or a nitride on an priming layer serving as a first layer and made of a metal or a metallic silicide;

forming a hole in a predetermined area of said second layer to partially expose the surface of said priming layer in an area thereof corresponding to said predetermined area;

heating an organic complex or organometallic compound of gold or copper as a starting material to evaporate the same;

heating said priming layer together with said second layer to a temperature equal to or higher than the decomposition temperature, on said priming layer, of a vapor of said starting material; and feeding the vapor of said evaporated starting material being kept at a temperature lower than the decomposition temperature thereof together with a reducing gas onto said heated priming layer and said second layer to selectively grow a thin metallic film of gold or copper only on the exposed surface of said priming layer.

18. A process for growing a thin metallic film, comprising steps of:

forming a first insulating layer on a semiconductor substrate;

forming a hole in a predetermined area of said first insulating layer to partially expose the surface of said substrate;

forming a polycrystalline silicon layer on the remaining first insulating layer and the exposed surface of said substrate;

forming on said polycrystalline silicon layer a priming layer made of at least one member selected from the group consisting of aluminum, titanium, tungsten, molybdenum, chromium, zirconium, tantalum, vanadium, and silicides thereof;

patterning said polycrystalline silicon layer together with said priming layer;

forming a second insulating layer on the remaining priming layer;

forming a hole in predetermined area of said second insulating layer to partially expose the surface of said remaining priming layer;

heating an organic complex or organometallic compound of gold or copper as a starting material to evaporate the same;

heating said substrate to a temperature equal to or higher than the decomposition temperature, on said remaining priming layer, of a vapor of said starting material; and feeding the vapor of said evaporated starting material being kept at a temperature lower than the decomposition temperature thereof together with a reducing gas onto said heated substrate to selectively grow a thin metallic film of gold or copper only on the exposed surface of said remaining priming layer.

19. A process for growing a thin metallic film as claimed in claim 18, wherein said priming layer is formed on said polycrystalline silicon layer with a layer of an electroconductive metallic nitride formed therebetween.

20. A process for growing a thin metallic film as claimed in claim 18, wherein said priming layer is formed on said polycrystalline silicon layer with a layer of an electroconductive metallic nitride and a layer of a metallic silicide formed therebetween.

21. A process for growing a thin metallic film, comprising steps of:

forming a first insulating layer on a semiconductor substrate;

forming a hole in a predetermined area of said first insulating layer to partially expose the surface of said substrate;

forming a polycrystalline silicon layer on the remaining first insulating layer and the exposed surface of said substrate;

patterning said polycrystalline silicon layer;

forming a second insulating layer on the remaining polycrystalline silicon layer;

forming a hole in a predetermined area of said second insulating layer to partially expose the surface of said remaining polycrystalline silicon layer;

forming on the exposed surface of said remaining polycrystalline silicon layer a priming layer made of at least one member selected from the group consisting of aluminum, titanium, tungsten, molybdenum, chromium, zirconium, tantalum, vanadium, and silicides thereof to fill up therewith said hole;

heating an organic complex or organometallic compound of gold or copper as a starting material to evaporate the same;

heating said substrate to a temperature equal to or higher than the decomposition temperature, on said priming layer, of a vapor of said starting material; and feeding the vapor of said evaporated starting material being kept at a temperature lower than the decomposition temperature thereof together with a reducing gas onto said heated substrate to selectively grow a thin metallic film of gold or copper only on the surface of said priming layer.

* * * * *